US011074963B2

(12) United States Patent
Huang et al.

(10) Patent No.: US 11,074,963 B2
(45) Date of Patent: Jul. 27, 2021

(54) NON-VOLATILE MEMORY AND MEMORY SECTOR THEREOF

(71) Applicant: eMemory Technology Inc., Hsin-Chu (TW)

(72) Inventors: Yu-Ping Huang, Hsinchu County (TW); Chun-Hung Lin, Hsinchu County (TW); Cheng-Da Huang, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 16/837,623

(22) Filed: Apr. 1, 2020

(65) Prior Publication Data
US 2020/0365200 A1 Nov. 19, 2020

Related U.S. Application Data

(60) Provisional application No. 62/847,246, filed on May 13, 2019.

(30) Foreign Application Priority Data

Mar. 13, 2020 (TW) ................. 109108390

(51) Int. Cl.
| G11C 7/00 | (2006.01) |
| G11C 11/4091 | (2006.01) |
| G11C 11/408 | (2006.01) |
| G11C 11/4094 | (2006.01) |
| G11C 5/06 | (2006.01) |
| G11C 11/4074 | (2006.01) |
| G11C 5/02 | (2006.01) |
| G11C 11/4093 | (2006.01) |

(52) U.S. Cl.
CPC .......... G11C 11/4091 (2013.01); G11C 5/025 (2013.01); G11C 5/06 (2013.01); G11C 11/4074 (2013.01); G11C 11/4085 (2013.01); G11C 11/4093 (2013.01); G11C 11/4094 (2013.01)

(58) Field of Classification Search
CPC .................................................. G11C 11/4094
USPC ........................................................ 365/230.08
See application file for complete search history.

(56) References Cited

U.S. PATENT DOCUMENTS

| 6,788,612 B2 * | 9/2004 | Hsu ........................ G11C 7/18 |
| | | 365/189.04 |
| 9,362,001 B2 | 6/2016 | Wu et al. |

(Continued)

FOREIGN PATENT DOCUMENTS

WO WO2011153669 A1 12/2011

*Primary Examiner* — Min Huang
(74) *Attorney, Agent, or Firm* — WPAT, PC

(57) ABSTRACT

A non-volatile memory includes a memory cell array, an amplifying circuit and a first multiplexer. The memory cell array includes m×n memory cells. The memory cell array is connected with a control line, m word lines and n local bit lines, wherein m and n are positive integers. The amplifying circuit includes n sensing elements. The n sensing elements are respectively connected between the n local bit lines and n read bit lines. The first multiplexer is connected with the n local bit lines and the n read bit lines. According to a first select signal, the first multiplexer selects one of the n local bit lines to be connected with a first main bit line and selects one of the n read bit lines to be connected with a first main read bit line.

22 Claims, 9 Drawing Sheets

(56) References Cited

U.S. PATENT DOCUMENTS

| | | | |
|---|---|---|---|
| 2003/0043672 A1* | 3/2003 | Inoue | G11C 11/406 365/222 |
| 2011/0156796 A1* | 6/2011 | Jang | G11C 8/08 327/436 |
| 2014/0063992 A1* | 3/2014 | Yoshida | G11C 7/22 365/194 |
| 2015/0009763 A1* | 1/2015 | Kumazaki | G11C 16/0483 365/185.21 |
| 2019/0108890 A1* | 4/2019 | Wang | G11C 7/067 |

* cited by examiner

NON-VOLATILE MEMORY AND MEMORY SECTOR THEREOF

This application claims the benefit of U.S. provisional application Ser. No. 62/847,246, filed May 13, 2019, and Taiwan application Serial No. 109108390, filed Mar. 13, 2020, the subject matters of which are incorporated herein by references.

FIELD OF THE INVENTION

The present invention relates to a non-volatile memory, and more particularly to a non-volatile memory and a memory sector for a low read voltage.

BACKGROUND OF THE INVENTION

As is well known, a non-volatile memory is able to continuously retain data after the supplied power is interrupted. Consequently, the non-volatile memory is widely applied to a variety of electronic devices. Generally, the non-volatile memories are classified into a one-time programmable non-volatile memory (also referred as an OTP non-volatile memory) and a multi-time programmable non-volatile memory (also referred as MTP non-volatile memory).

FIG. 1A is a schematic circuit diagram illustrating an OTP non-volatile memory cell. As shown in FIG. 1A, the OTP non-volatile memory cell c1 comprises an antifuse transistor Maf and a select transistor Msel. The first source/drain terminal of the antifuse transistor Maf is in a floating state. The gate terminal of the antifuse transistor Maf is connected with a control line CL. The first source/drain terminal of the select transistor Msel is connected with the second source/drain terminal of the antifuse transistor Maf. The gate terminal of the select transistor Msel is connected with a word line WL. The second source/drain terminal of the select transistor Msel is connected with a bit line BL.

When an on voltage is applied to the word line WL, the OTP non-volatile memory cell c1 may be considered as a selected memory cell. Consequently, a program action or a read action may be performed on the selected memory cell. When an off voltage is applied to the word line WL, the OTP non-volatile memory cell c1 is a non-selected memory cell. Meanwhile, the program action or the read action cannot be performed.

When the program action is performed, proper bias voltages are provided to the OTP non-volatile memory cell c1. Consequently, the gate oxide layer of the antifuse transistor Maf is ruptured or not ruptured.

For performing the program action, a program voltage is provided to the control line CL, the on voltage is provided to the word line WL, and a ground voltage (0V) is provided to the bit line BL. Since the voltage stress withstood by the gate oxide layer of the antifuse transistor Maf is equal to the program voltage, the gate oxide layer of the antifuse transistor Maf is ruptured. Whereas, if the voltage stress withstood by the gate oxide layer of the antifuse transistor Maf is lower than the program voltage, the gate oxide layer of the antifuse transistor Maf is not ruptured. In case that the gate oxide layer of the antifuse transistor Maf is ruptured, the OTP non-volatile memory cell c1 is in a first storage state (i.e., a low resistance state). Whereas, in case that the gate oxide layer of the antifuse transistor Maf is not ruptured, the OTP non-volatile memory cell c1 is in a second storage state (i.e., a high resistance state).

For performing the read action, proper bias voltages are provided to the OTP non-volatile memory cell c1. Consequently, the OTP non-volatile memory cell c1 generates a read current. According to the magnitude of the read current, the storage state of the OTP non-volatile memory cell c1 can be judged.

When the read action is performed, a read voltage is provided to the control line CL, the on voltage is provided to the word line WL, and the ground voltage is provided to the bit line BL. In case that the OTP non-volatile memory cell c1 is in the first storage state (i.e., the low resistance state), the read current is higher. In case that the OTP non-volatile memory cell c1 is in the second storage state (i.e., the high resistance state), the read current is nearly zero.

The bit line BL of the OTP non-volatile memory cell c1 is connected with a judging circuit (not shown). The judging circuit compares the read current and a reference current. If the read current is higher than the reference current, the judging circuit determines that the OTP non-volatile memory cell c1 is in the first storage state (i.e., the low resistance state). Whereas, if the read current is lower than the reference current, the judging circuit determines that the OTP non-volatile memory cell c1 is in the second storage state (i.e., the high resistance state). For example, the judging circuit is a sense amplifier.

Generally, the magnitude of the program voltage is higher than the magnitude of the read voltage. For example, the program voltage is 12V, and the read voltage is 1.2V. Since the program voltage is very high, the OTP non-volatile memory cell c1 is further equipped with a following transistor to prevent from damage of the select transistor Msel during the program cycle.

FIG. 1B is a schematic circuit diagram illustrating another OTP non-volatile memory cell. As shown in FIG. 1B, the OTP non-volatile memory cell c2 comprises an antifuse transistor Maf, a following transistor Mg and a select transistor Msel. The first source/drain terminal of the antifuse transistor Maf is in a floating state. The gate terminal of the antifuse transistor Maf is connected with a control line CL. The first source/drain terminal of the following transistor Mg is connected with the second source/drain terminal of the antifuse transistor Maf. The gate terminal of the following transistor Mg is connected with a following line FL. The first source/drain terminal of the select transistor Msel is connected with the second source/drain terminal of the following transistor Mg. The gate terminal of the select transistor Msel is connected with a word line WL. The second source/drain terminal of the select transistor Msel is connected with a bit line BL.

Generally, the operation of the select transistor Msel and the operation of the following transistor Mg are similar. When the select transistor Msel is turned on, the following transistor Mg is turned on. When the select transistor Msel is turned off, the following transistor Mg is turned off. The bias voltages and the operating principles of the OTP non-volatile memory cell c2 for performing the program action and the read action are similar to those of the OTP non-volatile memory cell c1, and are not redundantly described herein.

FIG. 1C is a schematic circuit diagram illustrating another OTP non-volatile memory cell. As shown in FIG. 1C, the OTP non-volatile memory cell c3 comprises a floating gate transistor Mf and a select transistor Msel. The first source/drain terminal of the floating gate transistor Mf is connected with a control line CL. The first source/drain terminal of the select transistor Msel is connected with the second source/ drain terminal of the floating gate transistor Mf. The gate terminal of the select transistor Msel is connected with a word line WL. The second source/drain terminal of the select transistor Msel is connected with a bit line BL.

When the program action is performed, proper bias voltages are provided to the OTP non-volatile memory cell c3. Consequently, hot carriers are injected into the floating gate of the floating gate transistor Mf or are not injected into the floating gate of the floating gate transistor Mf. For example, the hot carriers are electrons.

For performing the program action, a program voltage is provided to the control line CL, an on voltage is provided to the word line WL, and a ground voltage is provided to the bit line BL. Consequently, the hot carriers are injected into the floating gate through a channel region of the floating gate transistor Mf. On the other hand, the hot carriers are not injected into the floating gate according to the applied bias voltages during the program action. In case that the hot carriers are stored in the floating gate of the floating gate transistor Mf, the OTP non-volatile memory cell c3 is in a first storage state (i.e., an on state). Whereas, in case that the hot carriers are not stored in the floating gate of the floating gate transistor Mf, the OTP non-volatile memory cell c3 is in a second storage state (i.e., an off state).

For performing the read action, proper bias voltages are provided to the OTP non-volatile memory cell c3. Consequently, the OTP non-volatile memory cell c3 generates a read current. According to the magnitude of the read current, the storage state of the OTP non-volatile memory cell c3 can be judged.

When the read action is performed, a read voltage is provided to the control line CL, the on voltage is provided to the word line WL, and the ground voltage is provided to the bit line BL. In case that the OTP non-volatile memory cell c3 is in the first storage state (i.e., the on state), the read current is higher. In case that the OTP non-volatile memory cell c3 is in the second storage state (i.e., the off state), the read current is nearly zero. The bit line BL of the OTP non-volatile memory cell c3 is connected with a judging circuit (not shown). The judging circuit can judge whether the OTP non-volatile memory cell c3 is in the first storage state (i.e., the on state) or the second storage state (i.e., the off state).

In order to prevent from damage of the select transistor Msel during the program cycle, the OTP non-volatile memory cell is further equipped with a following transistor. FIG. 1D is a schematic circuit diagram illustrating another OTP non-volatile memory cell. As shown in FIG. 1D, the OTP non-volatile memory cell c4 comprises a floating gate transistor Mf, a following transistor Mg and a select transistor Msel. The first source/drain terminal of the floating gate transistor Mf is connected with a control line CL. The first source/drain terminal of the following transistor Mg is connected with the second source/drain terminal of the floating gate transistor Mf. The gate terminal of the following transistor Mg is connected with a following line FL. The first source/drain terminal of the select transistor Msel is connected with the second source/drain terminal of the following transistor Mg. The gate terminal of the select transistor Msel is connected with a word line WL. The second source/drain terminal of the select transistor Msel is connected with a bit line BL.

Generally, the operation of the select transistor Msel and the operation of the following transistor Mg are similar. When the select transistor Msel is turned on, the following transistor Mg is turned on. When the select transistor Msel is turned off, the following transistor Mg is turned off. The bias voltages and the operating principles of the OTP non-volatile memory cell c4 for performing the program action and the read action are similar to those of the OTP non-volatile memory cell c3, and are not redundantly described herein.

Moreover, the hot carriers stored in the OTP non-volatile memory cells c3 and c4 may be ejected from the floating gate through the irradiation of UV light beam. Moreover, the OTP non-volatile memory cells c3 and c4 may be modified as MTP memory cells.

FIG. 1E is a schematic circuit diagram illustrating an MTP non-volatile memory cell. In comparison with the OTP non-volatile memory cell c3 of FIG. 1O, the MTP non-volatile memory cell c5 further comprises an erase capacitor C. The erase capacitor C is connected between the floating gate of the floating gate transistor Mf and an erase line EL. The bias voltages of the MTP non-volatile memory cell c5 for performing the program action and the read action are similar to those of the OTP non-volatile memory cell c3. Moreover, a ground voltage is provided to the erase line EL. The operating principles are not redundantly described herein.

For performing an erase action, an erase voltage is provided to the erase line EL. Consequently, the hot carriers are moved from the erase capacitor C to the erase line EL and ejected from the floating gate.

FIG. 1F is a schematic circuit diagram illustrating another MTP non-volatile memory cell. In comparison with the OTP non-volatile memory cell c4 of FIG. 1D, the MTP non-volatile memory cell c6 further comprises an erase capacitor C. The erase capacitor C is connected between the floating gate of the floating gate transistor Mf and an erase line EL. The bias voltages of the MTP non-volatile memory cell c6 for performing the program action and the read action are similar to those of the OTP non-volatile memory cell c4. Moreover, a ground voltage is provided to the erase line EL. The operating principles are not redundantly described herein.

Similarly, for performing an erase action, an erase voltage is provided to the erase line EL. Consequently, the hot carriers are moved from the erase capacitor C to the erase line EL and ejected from the floating gate.

In the OTP non-volatile memory cells as shown in FIGS. 1A-1F, the transistors are P-type transistors. Alternatively, the transistors of the OTP non-volatile memory cells and the MTP non-volatile memory cells are N-type transistors.

FIG. 2 is a schematic circuit diagram illustrating a conventional non-volatile memory. As shown in FIG. 2, the non-volatile memory 200 comprises a memory cell array 210, a multiplexer 220 and a processing circuit 230. The memory cell array 210 comprises plural memory cells c11~cmn, which are arranged in an m×n array. The n memory cells c11~c1n in the first row are connected with a word line WL1 and a control line CL. The memory cells c11~c1n are connected with corresponding local bit lines LBL1~LBLn, respectively. The n memory cells c21~c2n in the second row are connected with a word line WL2 and the control line CL. The memory cells c21~c2n are connected with the corresponding local bit lines LBL1~LBLn, respectively. The n memory cells cm1~cmn in the m-th row are connected with a word line WLm and the control line CL. The memory cells cm1~cmn are connected with the corresponding local bit lines LBL1~LBLn, respectively.

Any of the memory cells c1~c6 as shown in FIGS. 1A-1F may be used as the memory cell of the memory cells c11~cmn in the memory cell array 210. For example, plural OTP non-volatile memory cells c1 as shown in FIG. 1A may be formed as the OTP memory cell array 210. In case that plural OTP non-volatile memory cells c2 as shown in FIG. 1B are formed as the OTP memory cell array 210, the memory cell array 210 further comprises m following lines FL1~FLm (not shown). Each following line is connected with one row of OTP non-volatile memory cells. In case that plural MTP non-volatile memory cells c6 are formed as the MTP memory cell array 210, the memory cell array 210 further comprises an erase line EL (not shown) and m following lines FL1~FLm (not shown). The erase line EL is connected with all MTP non-volatile memory cells. Each following line is connected with one row of MTP non-volatile memory cells.

The multiplexer 220 is connected with all of the local bit lines LBL1~LBLn. The multiplexer 220 comprises n switches w1~wn. The first terminals of the switches w1~wn are connected with the corresponding local bit lines LBL1~LBLn, respectively. The second terminals of the switches w1~wn are connected with a data line DL. The switches w1~wn of the multiplexer 220 are P-type transistors, N-type transistors or transmission gates. The multiplexer 220 receives a select signal Sa. According to the select signal Sa, one of the n switches w1~wn is selected to be in a close state and the other switches are in an open state.

The processing circuit 230 is connected with the data line DL. The processing circuit 230 comprises a write buffer 232 and a judging circuit 234. When the program action is performed, the write buffer 232 is enabled. When the read action is performed, the judging circuit 234 is enabled. For describing the program action and the read action, the memory cell c22 is taken as an example of the selected memory cell.

For performing the program action, a program voltage is provided to the control line CL, an on voltage is provided to the word line WL2, an off voltage is provided to the other word lines WL1 and WL3~WLm, and a ground voltage (0V) is provided to the data line DL. In addition, the select signal is "2". Meanwhile, the switch w2 of the multiplexer 220 is in the close state, and the memory cell c22 of the memory cell array 210 is the selected memory cell. Consequently, a program current generated by the selected memory cell c22 flows to the write buffer 232 of the processing circuit 230 through the local bit line LBL2, the switch w2 and the data line DL. Under this circumstance, the selected memory cell c22 is programmed to be in the first storage state.

When the read action is performed, a read voltage is provided to the control line CL, the on voltage is provided to the word line WL2, the off voltage is provided to the other word lines WL1 and WL3~WLm, and the ground voltage (0V) is provided to the data line DL. In addition, the select signal is "2". Meanwhile, the switch w2 of the multiplexer 220 is in the close state, and the memory cell c22 of the memory cell array 210 is the selected memory cell. Consequently, a read current generated by the selected memory cell c22 flows to the judging circuit 234 of the processing circuit 230 through the local bit line LBL2, the switch w2 and the data line DL. According to the read current, the judging circuit 234 generates a data signal "data" to indicate the storage state of the selected memory cell c22.

Generally, during the read action of the non-volatile memory 200, the magnitude of the read voltage is at least 1.2V. If the magnitude of the read voltage is decreased, the read current generated by the selected memory cell is possibly too low. Under this circumstance, the judging circuit 234 may misjudge the storage state of the selected memory cell. That is, the storage state of the selected memory cell cannot be judged accurately.

SUMMARY OF THE INVENTION

The present invention provides a non-volatile memory and a memory sector for a low read voltage. During the read action, the low read voltage is provided to the memory cell array. The non-volatile memory is still able to judge the storage state of the selected memory cell accurately.

An embodiment of the present invention provides a non-volatile memory. The non-volatile memory includes a first memory sector. The first memory sector includes a memory cell array, an amplifying circuit and a first multiplexer. The memory cell array includes m×n memory cells. The memory cell array is connected with a control line, m word lines and n local bit lines, wherein m and n are positive integers. The amplifying circuit includes n sensing elements. The n sensing elements are respectively connected between the n local bit lines and n read bit lines. The first multiplexer is connected with the n local bit lines and the n read bit lines. According to a first select signal, the first multiplexer selects one of the n local bit lines to be connected with a first main bit line and selects one of the n read bit lines to be connected with a first main read bit line.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 3A:
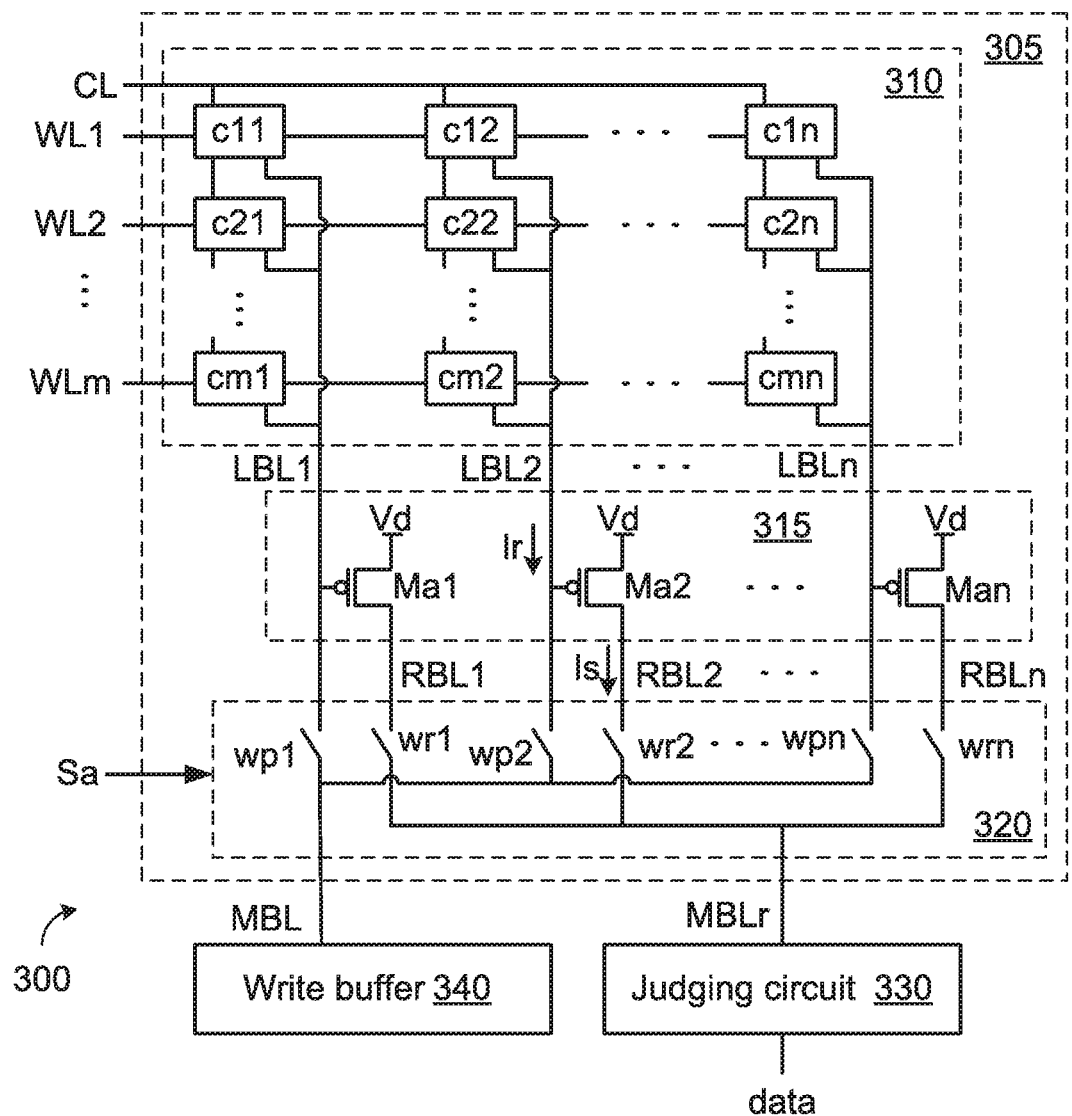
FIG. 3A is a schematic circuit diagram illustrating a non-volatile memory according to a first embodiment of the present invention.

FIG. 3A is a schematic circuit diagram illustrating a non-volatile memory according to a first embodiment of the present invention. As shown in FIG. 3, the non-volatile memory 300 comprises a memory sector 305, a write buffer 340 and a judging circuit 330. The memory sector 305 comprises a memory cell array 310, an amplifying circuit 315 and a multiplexer 320.

The memory cell array 310 comprises plural memory cells c11~cmn, which are arranged in an m×n array. The n memory cells c11~c1n in the first row are connected with a word line WL1 and a control line CL. The memory cells c11~c1n are connected with corresponding local bit lines LBL1~LBLn, respectively. The n memory cells c21~c2n in the second row are connected with a word line WL2 and the control line CL. The memory cells c21~c2n are connected with the corresponding local bit lines LBL1~LBLn, respectively. The n memory cells cm1~cmn in the m-th row are connected with a word line WLm and the control line CL. The memory cells cm1~cmn are connected with the corresponding local bit lines LBL1~LBLn, respectively.

Figure 1A:
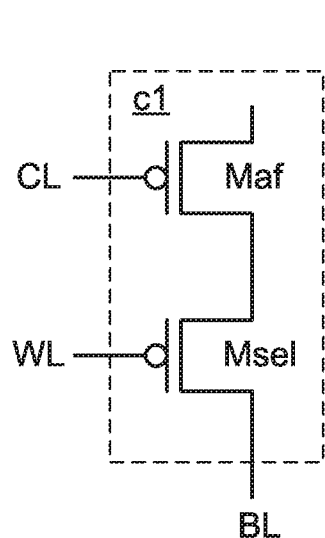
FIG. 1A (prior art) is a schematic circuit diagram illustrating an OTP non-volatile memory cell.
Figure 1B:
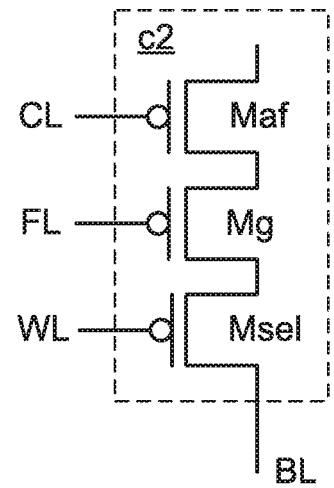
FIG. 1B (prior art) is a schematic circuit diagram illustrating another OTP non-volatile memory cell.
Figure 1C:
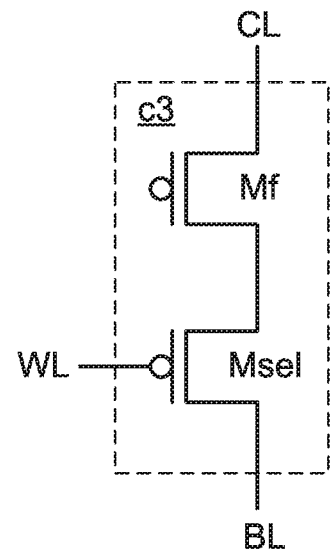
FIG. 1C (prior art) is a schematic circuit diagram illustrating another OTP non-volatile memory cell.
Figure 1D:
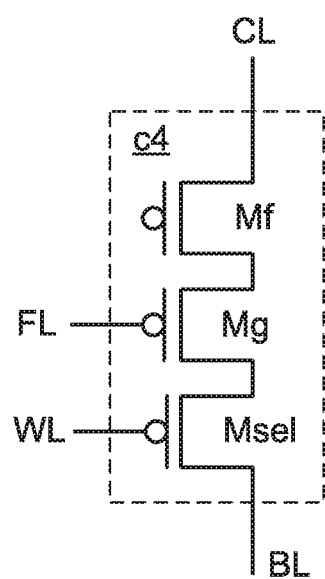
FIG. 1D (prior art) is a schematic circuit diagram illustrating another OTP non-volatile memory cell.
Figure 1E:
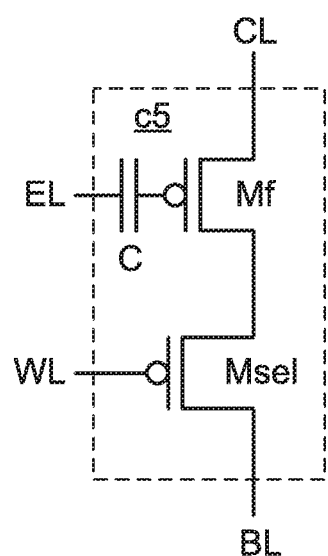
FIG. 1E (prior art) is a schematic circuit diagram illustrating an MTP non-volatile memory cell.
Figure 1F:
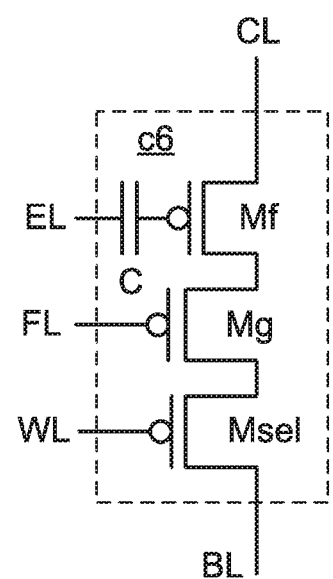
FIG. 1F (prior art) is a schematic circuit diagram illustrating another MTP non-volatile memory cell.
Figure 2:
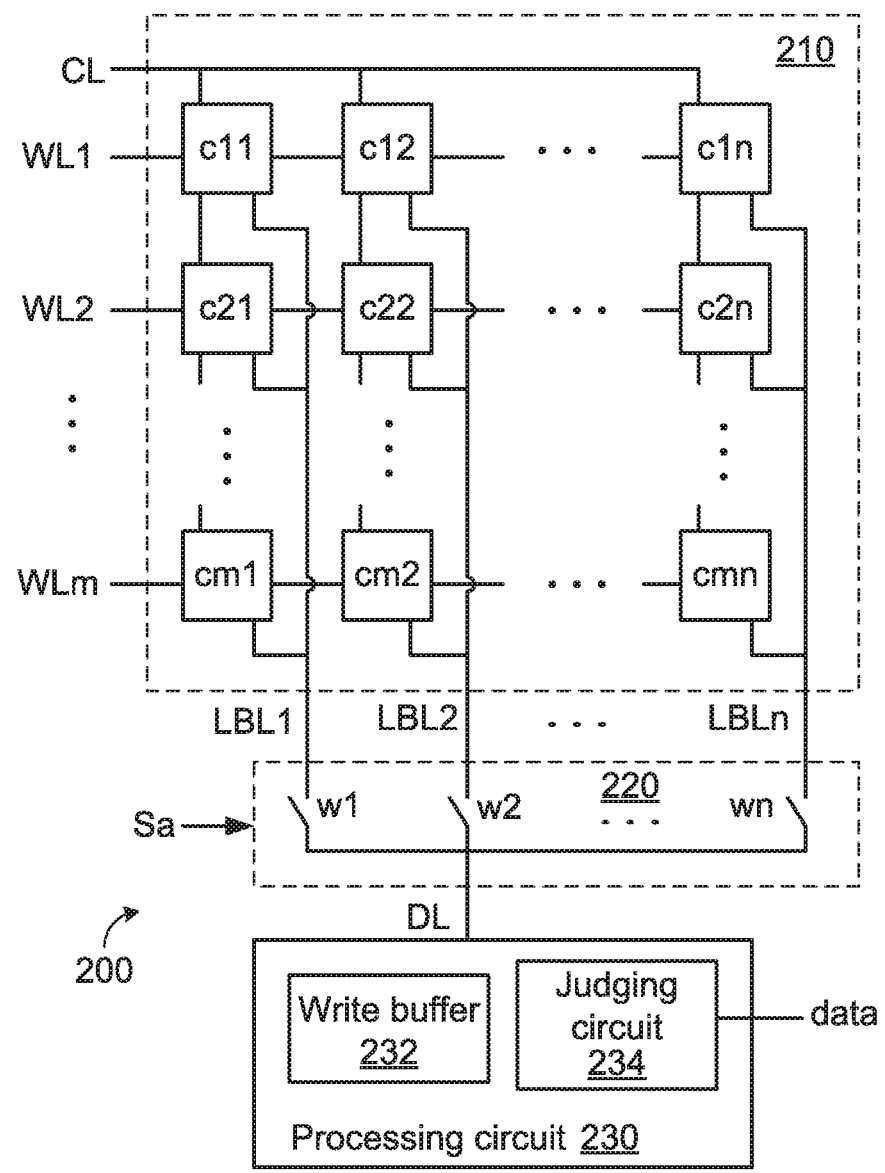
FIG. 2 (prior art) is a schematic circuit diagram illustrating a conventional non-volatile memory.

Any of the memory cells c1~c6 as shown in FIGS. 1A-1F may be used as the memory cell of the memory cells c11~cmn in the memory cell array 310. For example, plural OTP non-volatile memory cells c1 as shown in FIG. 1A may be formed as the OTP memory cell array 310. In case that plural OTP non-volatile memory cells c2 as shown in FIG. 1B are formed as the OTP memory cell array 310, the memory cell array 310 further comprises m following lines FL1~FLm (not shown). Each following line is connected with one row of OTP non-volatile memory cells. In case that plural MTP non-volatile memory cells c6 are formed as the MTP memory cell array 310, the memory cell array 310 further comprises an erase line EL (not shown) and m following lines FL1~FLm (not shown). The erase line EL is connected with all MTP non-volatile memory cells. Each following line is connected with one row of MTP non-volatile memory cells.

The amplifying circuit 315 comprises n sensing elements. The n sensing elements are connected between the corresponding local bit lines LBL1~LBLn and corresponding read bit lines RBL1~RBLn, respectively. In an embodiment, the n sensing elements include n sensing transistors Ma1~Man. The gate terminal of the sensing transistor Ma1 is connected with the local bit line LBL1. The first source/drain terminal of the sensing transistor Ma1 receives a first source voltage Vd. The second source/drain terminal of the sensing transistor Ma1 is connected with the read bit line RBL1. The gate terminal of the sensing transistor Ma2 is connected with the local bit line LBL2. The first source/drain terminal of the sensing transistor Ma2 receives the first source voltage Vd. The second source/drain terminal of the sensing transistor Ma2 is connected with the read bit line RBL2. The rest may be deduced by analog. In this embodiment, the sensing transistors are P-type transistors. Alternatively, the sensing transistors are N-type transistors.

The multiplexer 320 is connected with all of the local bit lines LBL1~LBLn and all of the read bit lines RBL1~RBLn.

The multiplexer 320 comprises a first group of n switches wp1~wpn. The first terminals of the switches wp1~wpn are connected with the corresponding local bit lines LBL1~LBLn, respectively. The second terminals of the switches wp1~wpn are connected with a main bit line MBL. The multiplexer 320 further comprises a second group of n switches wr1~wrn. The first terminals of the switches wr1~wrn are connected with the corresponding read bit lines RBL1~RBLn, respectively. The second terminals of the switches wr1~wrn are connected with a main read bit line MBLr. The n switches wp1~wpn and the n switches wr1~wrn are P-type transistors, N-type transistors or transmission gates.

The multiplexer 320 receives a select signal Sa. According to the select signal Sa, one of the n switches wp1~wpn in the first group is selected to be in a close state and the other switches are in an open state. Moreover, according to the select signal Sa, one of the n switches wr1~wrn in the second group is selected to be in a close state and the other switches are in an open state. In an embodiment, the switches of the n switches wp1~wpn and the n switches wr1~wrn with the same number are in the close state according to the select signal Sa. For example, if the select signal Sa is "1", the switches wp1 and wr1 of the multiplexer 320 are in the close state.

The judging circuit 330 is connected with the main read bit line MBLr. During the read action, the judging circuit 330 generates a data signal "data" to indicate the storage state of the selected memory cell according to the sensed read current of the main read bit line MBLr.

The write buffer 340 is connected with the main bit line MBL. During the program action, the write buffer 340 is enabled. During the program action, the write buffer 340 receives the program current from the selected memory cell.

For performing the program action, a program voltage is provided to the control line CL, an on voltage is provided to the word line WL2, an off voltage is provided to the other word lines WL1 and WL3~WLm, and a ground voltage (0V) is provided to the main bit line MBL. In addition, the select signal Sa is "2". Meanwhile, the switches wp2 and wr2 of the multiplexer 320 are in the close state, and the memory cell c22 of the memory cell array 310 is the selected memory cell. Consequently, a program current generated by the selected memory cell c22 flows to the write buffer 340 through the local bit line LBL2, the switch wp2 and the main bit line MBL. Under this circumstance, the selected memory cell c22 is programmed to be in the first storage state.

Figure 3B:
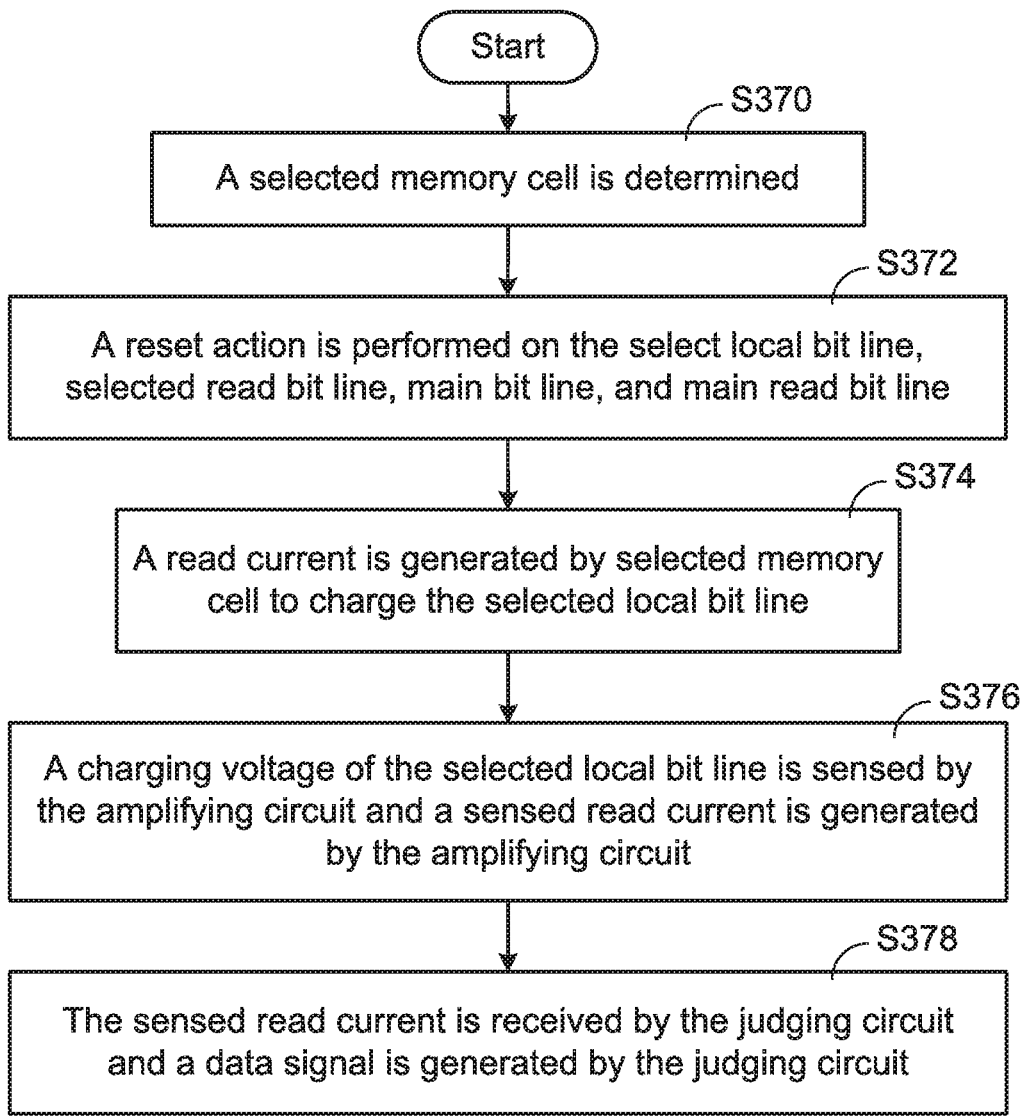
FIG. 3B is a read method applied to the first embodiment of the present invention.

FIG. 3B is a read method applied to the first embodiment of the present invention. When the read action is started, a selected memory cell is determined in response to the selected word line and the select signal Sa (S370). Take the selected memory cell c22 as an example, when the read action is performed, a read voltage is provided to the control line CL, the on voltage is provided to the word line WL2, the off voltage is provided to the other word lines WL1 and WL3~WLm, and the ground voltage (0V) is provided to the main bit line MBL. In addition, the select signal Sa is "2". Meanwhile, the switch wr2 of the multiplexer 320 is in the close state, and the memory cell c22 of the memory cell array 310 is the selected memory cell.

A reset action is then performed on the selected local bit line, the selected read bit line, the main bit line and the main read bit line (S372). That is to say, local bit line LBL2, RBL2, MBL and MBLr are reset to a reset voltage. For example, the reset voltage is the ground voltage (0V).

As shown in FIG. 3A, a read current Ir is generated by the selected memory cell c22 to charge the local bit line LBL2 after the reset action (S374). Moreover, a charging voltage of the selected local bit line is sensed by the amplifying circuit and a sensed current is generated by the amplifying circuit (S376). That is to say, according to the charging voltage of the local bit line LBL2, the sensing transistor Ma2 of the amplifying circuit 315 generates a sensed read current Is to the read bit line RBL2.

Then, the sensed current is received by the judging circuit and a data signal is generated by the judging circuit (S378). When the sensed read current Is is generated, the sensed read current flows to the judging circuit 330 through the read bit line RBL2, the switch wr2 and the main read bit line MBLr. According to the sensed read current Is, the judging circuit 330 judges the storage state of the selected memory cell c22 and the data signal "data" is generated. As mentioned above, the read current Ir from the local bit line LBL2 can be amplified as the sensed read current Is by the sensing transistor Ma2.

From the above descriptions, the multiplexer 320 is controlled according to the select signal Sa during the read action. The read current Ir is generated by the selected memory cell c22 to charge the local bit line LBL2. Moreover, the sensed read current Is is transmitted to the judging circuit 330.

In this embodiment, the non-volatile memory 300 comprises the amplifying circuit 315 for amplifying the read current Ir that is generated by the selected memory cell. During the read action, the lower read voltage is provided to the control line CL. Although the magnitude of the read current Ir generated by the selected memory cell is lower, the read current Ir flowing through the local bit line can be amplified into the sensed read current Is by the sensing transistor. The sensed read current Is is transmitted to the judging circuit 330 through the corresponding read bit line. Consequently, the judging circuit 330 can judge the storage state of the selected memory cell accurately.

For example, during the read action, the read voltage of 0.6V is provided to the control line CL. The selected memory cell c22 in the first storage state generates the read current Ir of 1 μA to the local bit line LBL2. The selected memory cell c22 in the second storage state generates the read current Ir of nearly 0A to the local bit line LBL2. By the sensing transistor Ma2, the read current Ir of 1 μA is amplified into the sensed read current Is of about 10 μA. The sensed read current Is of about 10 μA is transmitted to the judging circuit 330 through the read bit line RBL2. After the read current Ir of nearly 0A is amplified by the sensing transistor Ma2, the sensed read current Is is still very low. Consequently, according to the sensed read current Is, the judging circuit 330 can judge the storage state of the selected memory cell accurately.

Figure 4:
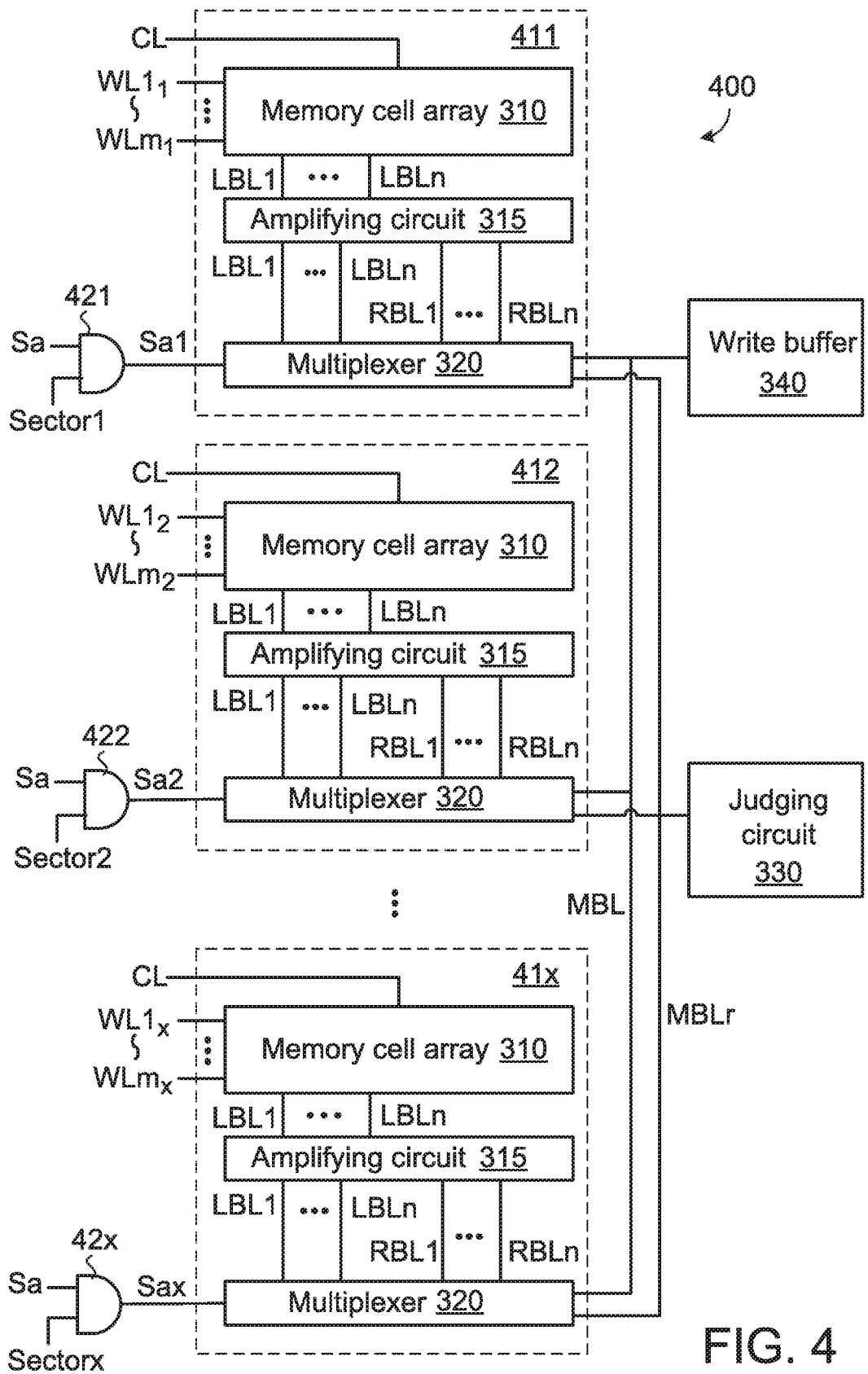
FIG. 4 is a schematic circuit diagram illustrating a non-volatile memory according to a second embodiment of the present invention.

The concepts of the present invention may be applied to a non-volatile memory with plural memory cell arrays. FIG. 4 is a schematic circuit diagram illustrating a non-volatile memory according to a second embodiment of the present invention. As shown in FIG. 4, the non-volatile memory 400 comprises x selecting circuit 421~42x, x memory sectors 411~41x, a write buffer 340 and a judging circuit 330. Each of the memory sectors 411~41x comprises a memory cell array 310, an amplifying circuit 315 and a multiplexer 320. The structure of each of the memory sectors 411~41x is similar to that of the memory sector 305, and is not redundantly described. Furthermore, x memory sectors 411~41x are connected with the write buffer 340 through the main bit line MBL, and x memory sectors 411~41x are connected with the judging circuit 330 through the main read bit line MBLr.

As shown in FIG. 4, x memory sectors 411~41x are connected to corresponding m word lines. For example, memory sector 411 is connected to m word lines $WL1_1$~$WLm_1$, memory sector 412 is connected to m word lines $WL1_2$~$WLm_2$, and so on, memory sector 41x is connected to m word lines $WL1_x$~$WLm_x$.

Also, x selection circuits 421~42x receive the select signal Sa and the corresponding sector signals sector1~sectorx. Taking the selection circuit 421 as an example, the selection circuit 421 generates a select signal Sa1 in response to the select signal Sa and the sector signal sector1. Basically, only one of the sector signals sector1~sectorx is activated and the other sector signals are inactivated.

For example, when the sector signal sector1 is activated and other sector signals sector2~sectorx are inactivated, the memory sector 411 is the selected memory sector, and the other memory sector 412~41x are non-selected memory sector. At this time, the select signal Sa is the same as the select signal Sa1, and the other select signals Sa2 to Sax do not operate. That is to say, the switches in the multiplex 320 of the selected memory sector 411 are controlled by the select signal Sa1, and the switches in the multiplexer 320 of the unselected memory sectors 412~41x are in the open state in response to the select signal Sa2~Sax. In other words, the unselected memory sectors 412~41x cannot perform the read action or the program action.

It is assumed that the non-volatile memory 400 operates and the memory sector 411 is the selected memory sector. During the read action, the memory sector 411 determines the selected memory cell in response to the word lines $WL1_1$~$WLm_1$ and the select signal Sa1. Therefore, the read current generated by the selected memory cell is transmitted to the write buffer 340 through the main bit line MBL. The sensed read current is transmitted to the judging circuit 330 through the read main bit line MBLr. According to the sensed read current, the judging circuit 330 can judge the storage state of the selected memory cell accurately.

Please refer to FIG. 3A again. In the memory cell array 310 of the non-volatile memory 300, each of the local bit lines LBL1~LBLn is connected with m memory cells. For example, the local bit line LBL2 is connected with the m memory cells c12~cm2.

For example, the memory cell c22 is the selected memory cell during the read action. The selected memory cell c22 generates a read current to the local bit line LBL2. The (m−1) memory cells c12 and c32~cm2 are unselected memory cells. These unselected memory cells generate leakage currents to the local bit line LBL2. In other words, the read current and the leakage currents are simultaneously provided to the local bit line LBL2. If the magnitudes of the leakage currents are very large, the sensed read current generated by the sensing transistor cannot reflect the actual read current. Under this circumstance, the misjudgment of the judging circuit 330 occurs. For solving this drawback, the non-volatile memory further comprises a leakage current cancellation circuit.

Figure 5A:
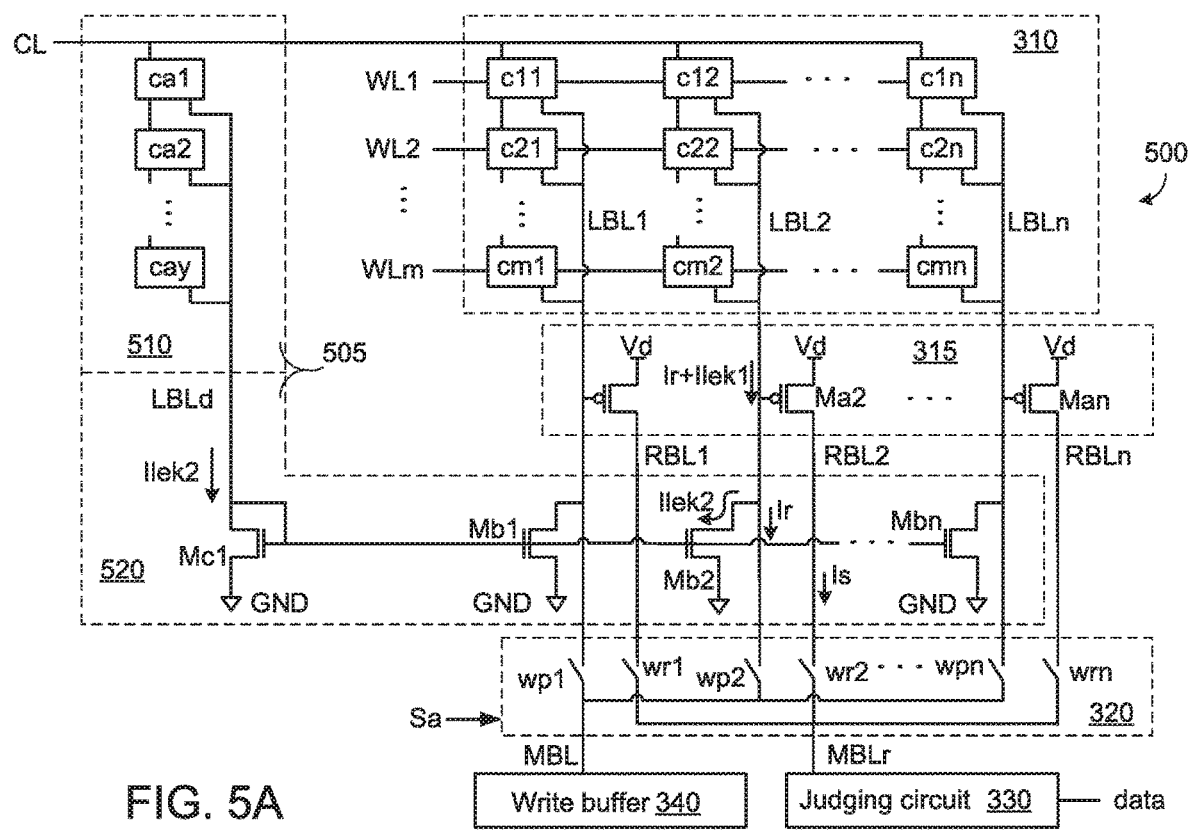
FIG. 5A is a schematic circuit diagram illustrating a non-volatile memory according to a third embodiment of the present invention.

FIG. 5A is a schematic circuit diagram illustrating a non-volatile memory according to a third embodiment of the present invention. In comparison with the first embodiment, the non-volatile memory 500 further comprises a leakage current cancellation circuit 505. The other components of the non-volatile memory 500 are similar to those of the non-volatile memory 300, and are not redundantly described.

In this embodiment, the leakage current cancellation circuit 505 comprises a leakage current generator 510 and a mirroring circuit 520. The leakage current generator 510 comprises plural memory cells ca1~cay. All of the memory cells ca1~cay are connected with the control line CL and a local bit line LBLd. The word lines (not shown) of the memory cells ca1~cay receive an off voltage. That is, all of the memory cells ca1~cay are unselected memory cells. Consequently, a total leakage current Ilek2 generated by the memory cells ca1~cay flows to the local bit line LBLd. It is noted that the number of the memory cells ca1~cay in the leakage current generator 510 may be determined according to the practical requirements. For example, the number y of the memory cells ca1~cay is equal to m.

The mirroring circuit 520 comprises a current input path and n current mirroring paths. The current input path is connected between the local bit line LBLd and a ground terminal GND. The n current mirroring paths are connected with the n local bit lines LBL1~LBLn and the ground terminal GND.

The current input path of the mirroring circuit 520 comprises a transistor Mc1. The first source/drain terminal of the transistor Mc1 is connected with the local bit line LBLd. The second source/drain terminal of the transistor Mc1 is connected with the ground terminal GND. The gate terminal of the transistor Mc1 is connected with the first source/drain terminal of the transistor Mc1. The n current mirroring paths are defined by the transistors Mb1~Mbn. The first source/drain terminal of the transistor Mb1 is connected with the local bit line LBL1. The second source/drain terminal of the transistor Mb1 is connected with the ground terminal GND. The gate terminal of the transistor Mb1 is connected with the gate terminal of the transistor Mc1. The first source/drain terminal of the transistor Mb2 is connected with the local bit line LBL2. The second source/drain terminal of the transistor Mb2 is connected with the ground terminal GND. The gate terminal of the transistor Mb2 is connected with the gate terminal of the transistor Mc1. The rest may be deduced by analog.

Figure 5B:
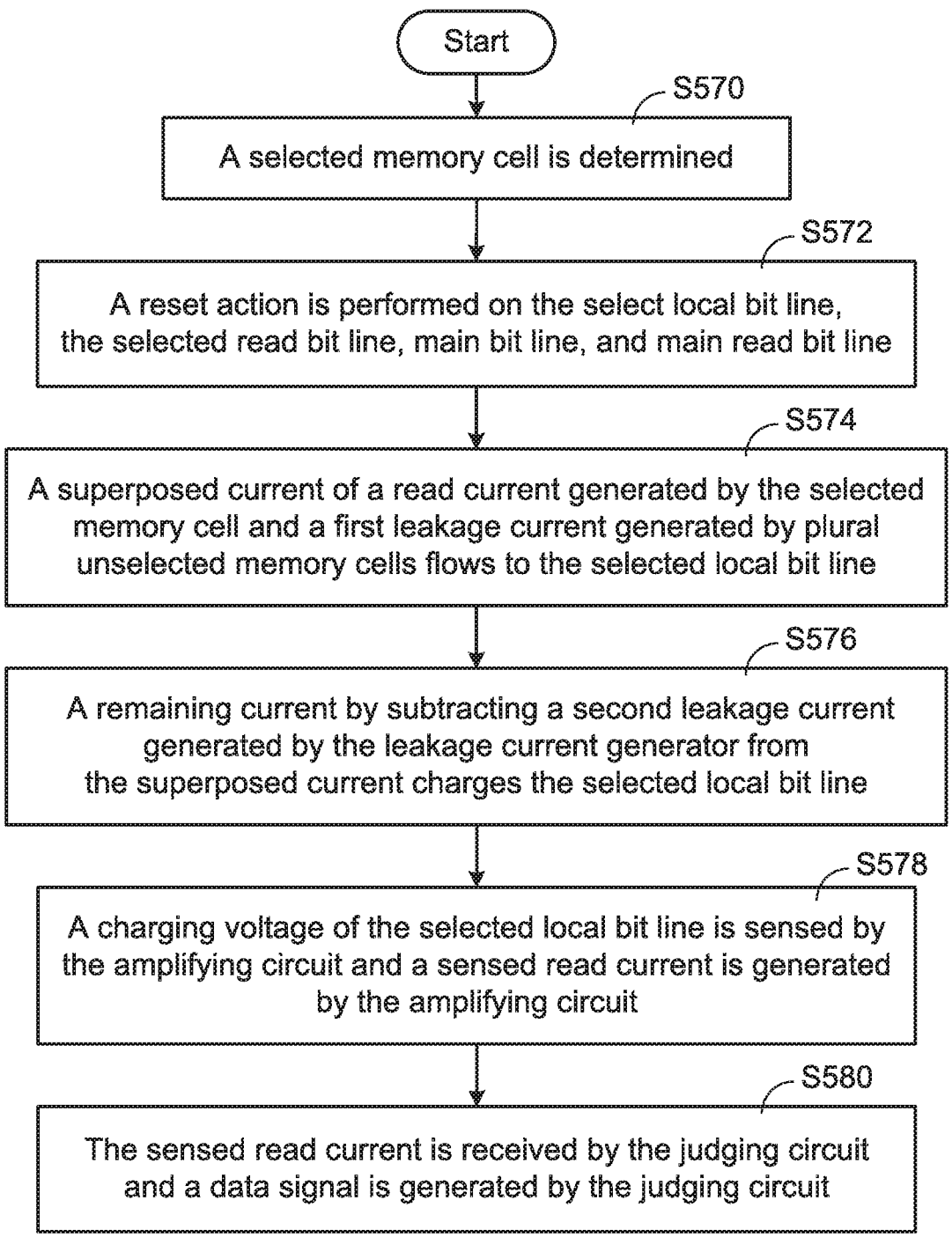
FIG. 5B is a read method applied to the third and the fourth embodiments of the present invention.

FIG. 5B is a read method applied to the third embodiment of the present invention. When the read action is started, a selected memory cell is determined in response to the selected word line and the select signal Sa (S570). Take the selected memory cell c22 as an example, when the read action is performed, a read voltage is provided to the control line CL, the on voltage is provided to the word line WL2, the off voltage is provided to the other word lines WL1 and WL3~WLm, and the ground voltage (0V) is provided to the main bit line MBL. In addition, the select signal Sa is "2". Meanwhile, the switch wr2 of the multiplexer 320 is in the close state, and the memory cell c22 of the memory cell array 310 is the selected memory cell.

A reset action is then performed on the selected local bit line, the selected read bit line, the main bit line and the main read bit line (S572). That is to say, local bit line LBL2, RBL2, MBL and MBLr are reset to a reset voltage. For example, the reset voltage is the ground voltage (0V).

After the reset action, a superposed current of a read current generated by the selected memory cell and a leakage current generated by plural unselected memory cells flows to the selected local bit line (S574). Please refer to FIG. 5A again. After the reset action, the selected memory cell c22 generates a read current Ir to the local bit line LBL2, and the unselected memory cells c12 and c32~cm2 generate the first leakage current Ilek1 to the local bit line LBL2. In other words, the superposed current flowing to the local bit line LBL2 is equal to Ir+Ilek1.

Moreover, a remaining current by subtracting a second leakage current generated by the leakage current generator from the superposed current charges the selected local bit line (S576). As shown in FIG. 5A, the leakage current generator 510 of the leakage current cancellation circuit 505 generates the second leakage current Ilek2 to the current input path of the mirroring circuit 520. Furthermore, the current mirroring path of the transistor Mb2 generates the second leakage current Ilek2. The second leakage current Ilek2 is transmitted from the local bit line LBL2 to the ground terminal GND. That is to say, the superposed current (Ir+Iek1) is subtracted from the second leakage current Ilek2. If the first leakage current Ilek1 is approximately equal to the second leakage current Ilek2, the local bit line LBL2 is only charged by the remaining current, i.e. read current Ir.

Moreover, a charging voltage of the selected local bit line is sensed by the amplifying circuit and a sensed current Is is generated by the amplifying circuit (S578). That is to say, according to the charging voltage of the local bit line LBL2, the sensing transistor Ma2 of the amplifying circuit 315 generates a sensed read current Is to the read bit line RBL2.

Then, the sensed current Is is received by the judging circuit and a data signal is generated by the judging circuit (S580). When the sensed read current Is is generated, the sensed read current Is flows to the judging circuit 330 through the read bit line RBL2, the switch wr2 and the main read bit line MBLr. According to the sensed read current Is, the judging circuit 330 judges the storage state of the selected memory cell c22 and the data signal "data" is generated. In other words, the sensed read current Is generated by the sensing transistor Ma2 can reflect the magnitude of the read current Ir accurately.

Figure 5C:
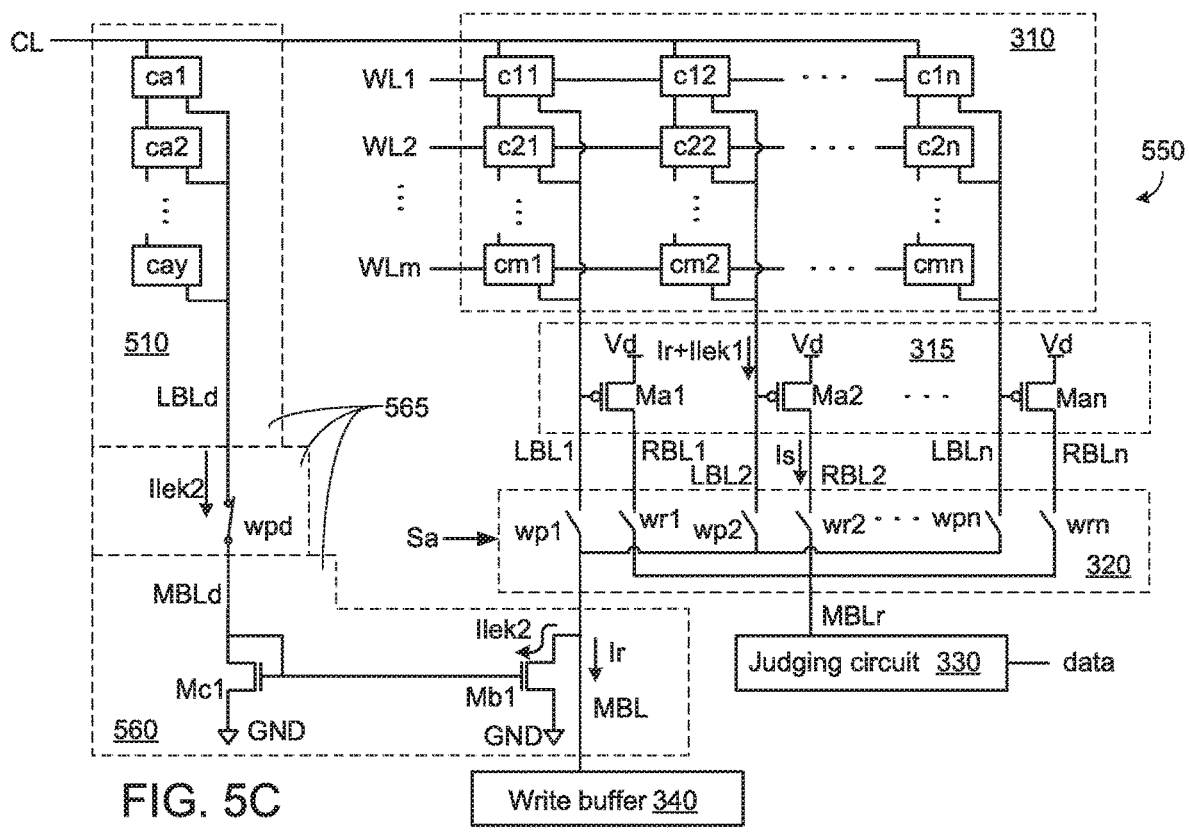
FIG. 5C is a schematic circuit diagram illustrating a non-volatile memory according to a fourth embodiment of the present invention.

FIG. 5C is a schematic circuit diagram illustrating a non-volatile memory according to a fourth embodiment of the present invention. In comparison with the first embodiment, the non-volatile memory 550 further comprises a leakage current cancellation circuit 565. The other components of the non-volatile memory 550 are similar to those of the non-volatile memory 300, and are not redundantly described.

In this embodiment, the leakage current cancellation circuit 565 comprises a leakage current generator 510, a switch wpd and a mirroring circuit 560. The leakage current generator 510 is similar to the leakage current generator 510 in the third embodiment, and is not redundantly described.

The mirroring circuit 560 comprises a current input path and a current mirroring path. The current input path is connected between the main bit line MBLd and a ground terminal GND. The current mirroring path is connected between main bit line MBL and the ground terminal GND. To have the same load with the main bit line MBL, the switch wpd with a close state is added between the local bit line LBLd and the main bit line MBLd. In another embodiment, the switch wpd may not be used, and the local bit line LBLd is directly connected with the main bit line MBLd.

The current input path of the mirroring circuit 560 comprises a transistor Mc1. The first source/drain terminal of the transistor Mc1 is connected with the main bit line MBLd. The second source/drain terminal of the transistor Mc1 is connected with the ground terminal GND. The gate terminal of the transistor Mc1 is connected with the first source/drain terminal of the transistor Mc1. The current mirroring path is defined by the transistor Mb1. The first source/drain terminal of the transistor Mb1 is connected with the main bit line MBL. The second source/drain terminal of the transistor Mb1 is connected with the ground terminal GND. The gate terminal of the transistor Mb1 is connected with the gate terminal of the transistor Mc1.

The same, the read method shown in FIG. 5B is also can be applied to the fourth embodiment of the present invention. During the read action, the selected memory cell c22 generates a read current Ir to the local bit line LBL2. The unselected memory cells c12 and c32~cm2 generate the first leakage current Ilek1 to the local bit line LBL2. In other words, the superposed current flowing to the local bit line LBL2 is equal to Ir+Ilek1.

Moreover, the leakage current generator 510 of the leakage current cancellation circuit 565 generates the second leakage current Ilek2 to the current input path of the mirroring circuit 560. Consequently, the current mirroring path of the transistor Mb1 generates the second leakage current Ilek2. The second leakage current Ilek2 is transmitted from the main bit line MBL to the ground terminal GND. Consequently, the local bit line LBL2 is charged by the read current Ir only. In other words, the sensed read current Is generated by the sensing transistor Ma2 can reflect the magnitude of the read current Ir accurately.

Figure 6A:
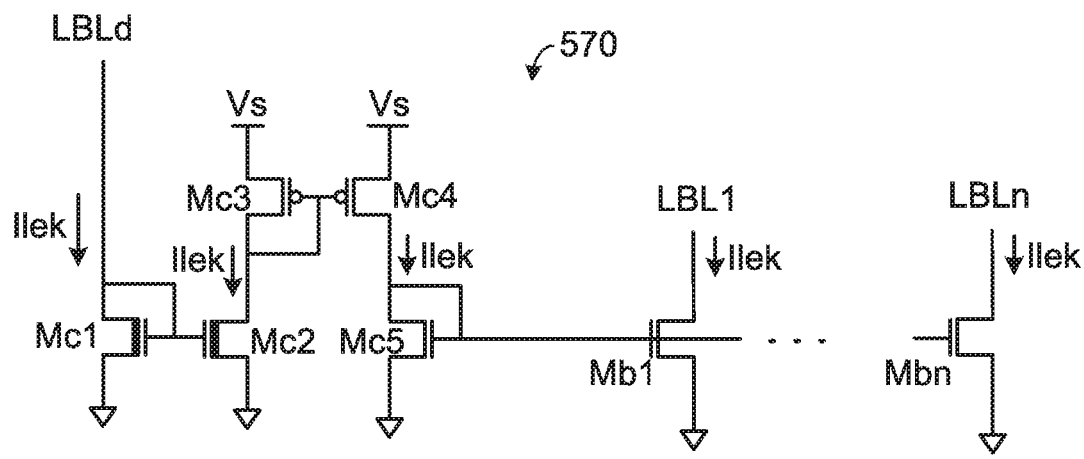
FIG. 6A is a schematic circuit diagram illustrating another example of the mirroring circuit for the third embodiment of the present invention.

It is noted that the structure of the mirroring circuit 520 of the leakage current cancellation circuit 505 is not restricted. FIG. 6A is a schematic circuit diagram illustrating another example of the mirroring circuit for the third embodiment of the present invention. As shown in FIG. 6A, the mirroring circuit 570 comprises three current mirrors. The first current mirror is defined by a transistor Mc1 and a transistor Mc2. The second current mirror is defined by a transistor Mc3 and a transistor Mc4. The third current mirror is defined by a transistor Mc5 and the transistors Mb1~Mbn. The transistor Mc1 and the transistor Mc2 are N-type depletion transistors. The transistor Mc3 and the transistor Mc4 are P-type transistors. The transistor Mc5 and the transistors Mb1~Mbn are N-type transistors.

The current input path of the first current mirror comprises the transistor Mc1. The current mirroring path of the first current mirror comprises the transistor Mc2. The current input path of the second current mirror comprises the transistor Mc3. The current mirroring path of the second current mirror comprises the transistor Mc4. The current input path of the third current mirror comprises the transistor Mc5. The current mirroring paths of the third current mirror comprise the transistors Mb1~Mbn.

The current input path of the first current mirror is connected with the local bit line LBLd. The current mirroring path of the first current mirror is connected with the current input path of the second current mirror. The current mirroring path of the second current mirror is connected with the current input path of the third current mirror. The n current mirroring paths of the third current mirror are connected with the corresponding n local bit lines LBL1~LBLn, respectively. Moreover, the current input path of the first current mirror receives the leakage current Ilek from the local bit line LBLd. Consequently, the current mirroring paths of the third current mirror generate the leakage current Ilek.

Figure 6B:
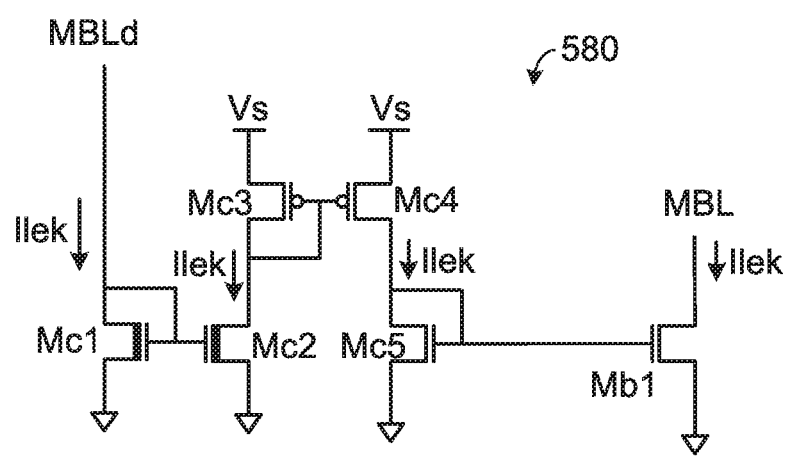
FIG. 6B is a schematic circuit diagram illustrating another example of the mirroring circuit for the fourth embodiment of the present invention.

The same, FIG. 6B is a schematic circuit diagram illustrating another example of the mirroring circuit for the fourth embodiment of the present invention. As shown in FIG. 6B, the mirroring circuit 580 comprises three current mirrors. The first current mirror is defined by a transistor Mc1 and a transistor Mc2. The second current mirror is defined by a transistor Mc3 and a transistor Mc4. The third current mirror is defined by a transistor Mc5 and the transistors Mb1. The transistor Mc1 and the transistor Mc2 are N-type depletion transistors. The transistor Mc3 and the transistor Mc4 are P-type transistors. The transistor Mc5 and the transistors Mb1 are N-type transistors.

The current input path of the first current mirror comprises the transistor Mc1. The current mirroring path of the first current mirror comprises the transistor Mc2. The current input path of the second current mirror comprises the transistor Mc3. The current mirroring path of the second current mirror comprises the transistor Mc4. The current input path of the third current mirror comprises the transistor Mc5. The current mirroring path of the third current mirror comprises the transistor Mb1.

The current input path of the first current mirror is connected with the main bit line MBLd. The current mirroring path of the first current mirror is connected with the current input path of the second current mirror. The current mirroring path of the second current mirror is connected with the current input path of the third current mirror. The current mirroring path of the third current mirror is connected with the main bit line MBL. Moreover, the current input path of the first current mirror receives the leakage current Ilek from the main bit line MBLd. Consequently, the current mirroring path of the third current mirror generates the leakage current Ilek.

From the above descriptions, the present invention provides a non-volatile memory and a memory sector for a low read voltage. During the read action, the low read voltage is provided to the memory cell array. Moreover, the read current from the selected memory cell is amplified into the sensed read current by the sensing element (i.e., the sensing transistor). Consequently, the non-volatile memory is still able to judge the storage state of the selected memory cell accurately.

Moreover, the non-volatile memory further comprises a leakage current cancellation circuit to eliminate the leakage current of the local bit line. Since the sensed read current can reflect the actual read current, the misjudgment of the judging circuit is avoided.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-volatile memory comprising a first memory sector, the first memory sector comprising:
    a memory cell array comprising m×n memory cells, wherein the memory cell array is connected with a control line, m word lines and n local bit lines, wherein m and n are positive integers;
    an amplifying circuit comprising n sensing elements, wherein the n sensing elements are respectively connected between the n local bit lines and n read bit lines; and
    a first multiplexer comprising a first group of n switches and a second group of n switches, wherein first terminals of the n switches in the first group are respectively connected with the n local bit lines, second terminals of the n switches in the first group are connected with the first main bit line, first terminals of the n switches in the second group are respectively connected with the n read bit lines, and second terminals of the n switches in the second group are connected with the first main read bit line,
    wherein during a reset action, one of the n switches in the first group is selected to be in a close state and one of the n switches in the second group is selected to be in the close state according to a first select signal; and, the first multiplexer selects one of the n local bit lines to be connected with a first main bit line and selects one of the n read bit lines to be connected with a first main read bit line.

2. The non-volatile memory as claimed in claim 1, wherein the first main bit line is connected with a write buffer, and the first main read bit line is connected with a judging circuit.

3. The non-volatile memory as claimed in claim 1, wherein according to the first select signal, the first multiplexer controls one of the n switches in the first group to be in a close state and controls the others of the n switches in the first group to be in an open state, wherein according to the first select signal, the first multiplexer controls one of the n switches in the second group to be in the close state and controls the others of the n switches in the second group to be in the open state.

4. The non-volatile memory as claimed in claim 2, wherein when a read action is performed, a read voltage is provided to the control line, a selected memory cell of the memory cell array is determined according to voltages received by the m word lines and the first select signal, and the selected memory cell generates a read current to charge a first local bit line of the n local bit lines, wherein a first sensing element of the n sensing elements of the amplifying circuit generates a sensed read current according to a charging voltage of the first local bit line, and the sensed read current is transmitted to the judging circuit through a first read bit line of the n read bit lines and the first multiplexer and the first main read bit line, so that a storage state of the selected memory cell is determined by the judging circuit.

5. The non-volatile memory as claimed in claim 4, wherein the first sensing element is a sensing transistor, wherein a gate terminal of the sensing transistor is connected with the first local bit line, a first source/drain terminal of the sensing transistor receives a first source voltage, and a second source/drain terminal of the sensing transistor is connected with the first read bit line.

6. The non-volatile memory as claimed in claim 2, wherein when a program action is performed, a program voltage is provided to the control line, a selected memory cell of the memory cell array is determined according to voltages received by the m word lines and the first select signal, and the selected memory cell generates a program current, wherein the program current is transmitted to the write buffer through a first local bit line of the n local bit lines and the first multiplexer and the first main bit line.

7. A read method of the non-volatile memory as claimed in claim 1, the read method comprising steps of:
   determining a selected memory cell from the memory cell array;
   performing the reset action on a selected local bit line, a selected read bit line, the first main bit line and the main read bit line, wherein the selected local bit line and the selected read bit line are determined in response to the first select signal;
   using a read current generated by the selected memory cell to charge the selected local bit line;
   sensing a charging voltage of the selected local bit line and generating a sensed read current; and
   generating a data signal in response to the sensed read current.

8. The non-volatile memory as claimed in claim 1, further comprising a second memory sector, wherein the second memory sector receives a second select signal, and the second memory sector is connected with the control line and another m word lines, wherein the second memory sector is connected with the first main bit line and the first main read bit line.

9. The non-volatile memory as claimed in claim 8, further comprising a first selection circuit and a second selection circuit, wherein the first selection circuit generates the first select signal in response to a third select signal and a first sector signal, and the second selection circuit generates the second select signal in response to the third select signal and a second sector signal.

10. The non-volatile memory as claimed in claim 9, wherein one of the first sector signal and the second sector signal is activated when the non-volatile memory operates, the first select signal is the same as the third select signal when the first sector signal is activated, and the second select signal is the same as the third select signal when the second sector signal is activated.

11. The non-volatile memory as claimed in claim 1, further comprising a leakage current cancellation circuit, wherein the leakage current cancellation circuit comprises a leakage current generator and a mirroring circuit, a current input path of the mirroring circuit is connected between the leakage current generator and a ground terminal, and n current mirroring paths of the mirroring circuit are respectively connected between the n local bit lines and the ground terminal.

12. The non-volatile memory as claimed in claim 11, wherein the leakage current generator comprises plural memory cells, which are connected with the current input path of the mirroring circuit, wherein during a read action, the memory cells generate a leakage current to the current input path of the mirroring circuit.

13. The non-volatile memory as claimed in claim 12, wherein the mirroring circuit comprises:
   a controlling transistor, wherein a first source/drain terminal of the controlling transistor is connected with the leakage current generator, a second source/drain terminal of the controlling transistor is connected with the ground terminal, and a gate terminal of the controlling transistor is connected with the first source/drain terminal of the controlling transistor; and
   n mirroring transistors, wherein n first source/drain terminals of the mirroring transistors are respectively connected with the n local bit lines, n second source/drain terminals of the mirroring transistors are connected with the ground terminal, and n gate terminals of the mirroring transistors are connected with the gate terminal of the controlling transistor.

14. The non-volatile memory as claimed in claim 12, wherein the mirroring circuit comprises:
   a first current mirror, wherein a current input path of the first current mirror circuit is connected with the leakage current generator;
   a second current mirror, wherein a current input path of the second current mirror circuit is connected with a current mirroring path of the first current mirror;
   a third current mirror, wherein a current input path of the third current mirror circuit is connected with a current mirroring path of the second current mirror, and n current mirroring paths of the third current mirror are respectively connected with the n local bit lines.

15. A read method of the non-volatile memory as claimed in claim 11, the read method comprising steps of:
   determining a selected memory cell and plural unselected memory cells from the memory cell array;

performing the reset action on a selected local bit line, a selected read bit line, the first main bit line and the main read bit line, wherein the selected local bit line and the selected read bit line are determined in response to the first select signal;

flowing a superposed current comprising a read current generated by the selected memory cell and a first leakage current generated by the unselected memory cells to the selected local bit line;

using a remaining current to charge the selected local bit line, wherein the remaining current is obtained by subtracting a second leakage current generated by the leakage current generator from the superposed current;

sensing a charging voltage of the selected local bit line and generating a sensed read current; and generating a data signal in response to the sensed read current.

16. The non-volatile memory as claimed in claim 1, further comprising a leakage current cancellation circuit, wherein the leakage current cancellation circuit comprises a leakage current generator and a mirroring circuit, a current input path of the mirroring circuit is connected between the leakage current generator and a ground terminal, and a current mirroring path of the mirroring circuit is connected between the first main bit line and the ground terminal.

17. The non-volatile memory as claimed in claim 16, wherein the leakage current generator comprises plural memory cells, which are connected with the current input path of the mirroring circuit, wherein during a read action, the memory cells generate a leakage current to the current input path of the mirroring circuit.

18. The non-volatile memory as claimed in claim 17, wherein the leakage current generator is connected with the current input path of the mirroring circuit through a switch with an close state.

19. The non-volatile memory as claimed in claim 17, wherein the mirroring circuit comprises:
a controlling transistor, wherein a first source/drain terminal of the controlling transistor is connected with the leakage current generator, a second source/drain terminal of the controlling transistor is connected with the ground terminal, and a gate terminal of the controlling transistor is connected with the first source/drain terminal of the controlling transistor; and
a mirroring transistors, wherein a first source/drain terminal of the mirroring transistor is connected with the first main bit line, a second source/drain terminal of the mirroring transistor is connected with the ground terminal, and a gate terminal of the mirroring transistor is connected with the gate terminal of the controlling transistor.

20. The non-volatile memory as claimed in claim 17, wherein the mirroring circuit comprises:
a first current mirror, wherein a current input path of the first current mirror circuit is connected with the leakage current generator;
a second current mirror, wherein a current input path of the second current mirror circuit is connected with a current mirroring path of the first current mirror;
a third current mirror, wherein a current input path of the third current mirror circuit is connected with a current mirroring path of the second current mirror, and a current mirroring path of the third current mirror is connected with the first main bit line.

21. A read method of the non-volatile memory as claimed in claim 16, the read method comprising steps of:
determining a selected memory cell and plural unselected memory cells from the memory cell array;
performing the reset action on a selected local bit line, a selected read bit line, the first main bit line and the main read bit line, wherein the selected local bit line and the selected read bit line are determined in response to the first select signal;
flowing a superposed current comprising a read current generated by the selected memory cell and a first leakage current generated by the unselected memory cells to the selected local bit line;
using a remaining current to charge the selected local bit line, wherein the remaining current is obtained by subtracting a second leakage current generated by the leakage current generator from the superposed current;
sensing a charging voltage of the selected local bit line and generating a sensed read current; and
generating a data signal in response to the sensed read current.

22. A read method of the non-volatile memory, wherein the non-volatile memory comprises: a memory cell array comprising m×n memory cells connected with a control line, m word lines and n local bit lines; an amplifying circuit comprising n sensing elements respectively connected between the n local bit lines and n read bit lines; a first multiplexer capable of selecting one of the n local bit lines to be connected with a first main bit line and selecting one of the n read bit lines to be connected with a first main read bit line in response to a first select signal; a leakage current generator; and a mirroring circuit comprising a current input path connected between the leakage current generator and a ground terminal and comprising n current mirroring paths respectively connected between the n local bit lines and the ground terminal, and wherein the read method comprises steps of:
determining a selected memory cell and plural unselected memory cells from the memory cell array;
performing a reset action on a selected local bit line, a selected read bit line, the first main bit line and the main read bit line, wherein the selected local bit line and the selected read bit line are determined in response to the first select signal;
flowing a superposed current comprising a read current generated by the selected memory cell and a first leakage current generated by the unselected memory cells to the selected local bit line;
using a remaining current to charge the selected local bit line, wherein the remaining current is obtained by subtracting a second leakage current generated by the leakage current generator from the superposed current;
sensing a charging voltage of the selected local bit line and generating a sensed read current; and
generating a data signal in response to the sensed read current,
wherein m and n are positive integers.

* * * * *